US011855442B2

(12) United States Patent
Filipetti et al.

(10) Patent No.: US 11,855,442 B2
(45) Date of Patent: Dec. 26, 2023

(54) SYSTEMS AND METHODS OF GROUNDED NEUTRAL FAULT DETECTION BY SINGLE FREQUENCY EXCITATION AND LEAKAGE SPECTRAL ANALYSIS

(71) Applicant: ABB Schweiz AG, Baden (CH)

(72) Inventors: John Paul Filipetti, Bloomfield, CT (US); Cecil Rivers, Jr., Bloomfield, CT (US); Lucas James McPhee, Bloomfield, CT (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/476,822

(22) Filed: Sep. 16, 2021

(65) Prior Publication Data

US 2023/0090349 A1 Mar. 23, 2023

(51) Int. Cl.
*G01R 31/52* (2020.01)
*H02H 3/33* (2006.01)
*H02H 3/16* (2006.01)

(52) U.S. Cl.
CPC ............. *H02H 3/331* (2013.01); *G01R 31/52* (2020.01); *H02H 3/162* (2013.01)

(58) Field of Classification Search
CPC .......... H02H 3/331; H02H 3/00; H02H 3/338; H02H 3/33; H02H 3/162; H02H 3/167; H02H 3/16; H02H 3/26; G01R 31/52; G01R 31/50; G01R 31/55
See application file for complete search history.

(56) References Cited

U.S. PATENT DOCUMENTS 8,908,338 B2 12/2014 Kinsel
2004/0156155 A1* 8/2004 Ward ..................... H02H 3/338 361/42
2008/0106268 A1 5/2008 Lewinski et al.
2010/0097733 A1* 4/2010 E. ......................... H02H 1/0015 361/42
2010/0309592 A1* 12/2010 Kinsel .................... H02H 3/331 361/50
2019/0128944 A1 5/2019 Englert et al.

* cited by examiner

*Primary Examiner* — Tarun Sinha
*Assistant Examiner* — James I Burris
(74) *Attorney, Agent, or Firm* — Armstrong Teasdale LLP

(57) ABSTRACT

A grounded neutral fault detector that includes induction circuits and a controller is provided. The controller is configured to determine a frequency of a test signal by measuring load noise based on a first leakage signal corresponding to a first current imbalance between the line conductor and the neutral conductor for the load without the test signal being injected, analyzing a frequency spectrum of the load noise, and selecting the frequency of the test signal. The controller is further configured to inject the test signal at the selected frequency to the neutral conductor, measure impedance of a current loop formed by a potential grounded neutral fault based on a second leakage signal corresponding to a second current imbalance with the test signal being injected, and determine a grounded neutral fault.

20 Claims, 7 Drawing Sheets

SYSTEMS AND METHODS OF GROUNDED NEUTRAL FAULT DETECTION BY SINGLE FREQUENCY EXCITATION AND LEAKAGE SPECTRAL ANALYSIS

BACKGROUND

The field of the disclosure relates to alternating current (AC) circuits, and more particularly, to detecting neutral grounding conditions for AC circuits.

Utility supplied electrical power typically enters a premises location at an electrical panel as two hot lines L1 and L2, and a neutral conductor N, capable of supplying one hundred Amps or more. L1, L2, and N may then be segmented into a number of sub-circuits comprising i) line (e.g., L1 or L2), neutral (N), and a ground conductor (G), ii) line-line (L1, L2), neutral (N), and a ground conductor (G), or iii) line-line (L1, L2) and a ground conductor (G), depending on the desired end voltage for the sub-circuits. At the main electrical panel for the installation, the neutral conductors and the ground conductors of the circuits are grounded to the earth, typically through one or more grounding rods driven into the ground near the electrical panel. This scenario creates a single point ground for the neutral conductors of electrical system, ensures that the neutral conductors have a voltage that is substantially tied to the earth, and facilitates a current path through the earth in case of faults that may occur when electricity inadvertently flows outside of line-neutral, line-line-neutral, or line-line circuits.

Problems can arise when neutral conductors in the premises are grounded at both the electrical panel and at another location. This situation is referred to as a grounded neutral fault. A grounded neutral fault provides an additional current path to the electrical panel for the current flowing in an AC circuit, which can bypass fault detection circuits such as ground fault circuit interrupt (GFCI) devices and create a potential for damage. Grounded neutral faults can also cause nuisance trips, where the fault detection circuits trip without cause, thereby disconnecting the loads from the electrical panel. Nuisance trips are undesirable, because they may encourage users to disable the protection devices and/or remove the protection devices from the circuits.

Known GFCI circuits are disadvantaged in some aspects and improvements are desired.

BRIEF DESCRIPTION

In one aspect, a grounded neutral fault detector is provided. The grounded neutral fault detector includes induction circuits and a controller. The induction circuits are configured to generate a leakage signal corresponding to a current imbalance between a line conductor and a neutral conductor for a load. The controller is configured to determine a frequency of a test signal by measuring load noise based on a first leakage signal corresponding to a first current imbalance between the line conductor and the neutral conductor for the load without the test signal being injected, analyzing a frequency spectrum of the load noise, and selecting the frequency of the test signal based on the frequency spectrum. The controller is further configured to inject the test signal at the selected frequency to the neutral conductor, measure impedance of a current loop formed by a potential grounded neutral fault based on a second leakage signal corresponding to a second current imbalance with the test signal being injected, and determine a grounded neutral fault based on the measured impedance.

In another aspect, a method of detecting a grounded neutral fault is provided. The method includes determining a frequency of a test signal by measuring load noise based on a first leakage signal corresponding to a first current imbalance between a line conductor and a neutral conductor for a load without the test signal being injected, analyzing a frequency spectrum of the load noise; and selecting the frequency of the test signal based on the frequency spectrum. The method further includes injecting the test signal at the selected frequency to the neutral conductor, measuring impedance of a current loop formed by a potential grounded neutral fault based on a second leakage signal corresponding to a second current imbalance with the test signal injected, and determining a grounded neutral fault based on the measured impedance.

DRAWINGS

DETAILED DESCRIPTION

The disclosure includes systems and methods of detecting grounded neutral fault by injecting a grounded neutral test signal and analyzing the leakage current response to the test signal. The frequency of the test signal is selected based on analysis of the spectrum of leakage current without injecting the test signal, i.e., load noise, to avoid interference from the load noise. The current response to the injected grounded neutral test signal is used to measure impedance of a current loop formed by a potential grounded neutral fault, providing a direct and accurate detection of a grounded neutral fault. Method aspects will be in part apparent and in part explicitly discussed in the following description.

Figure 1:
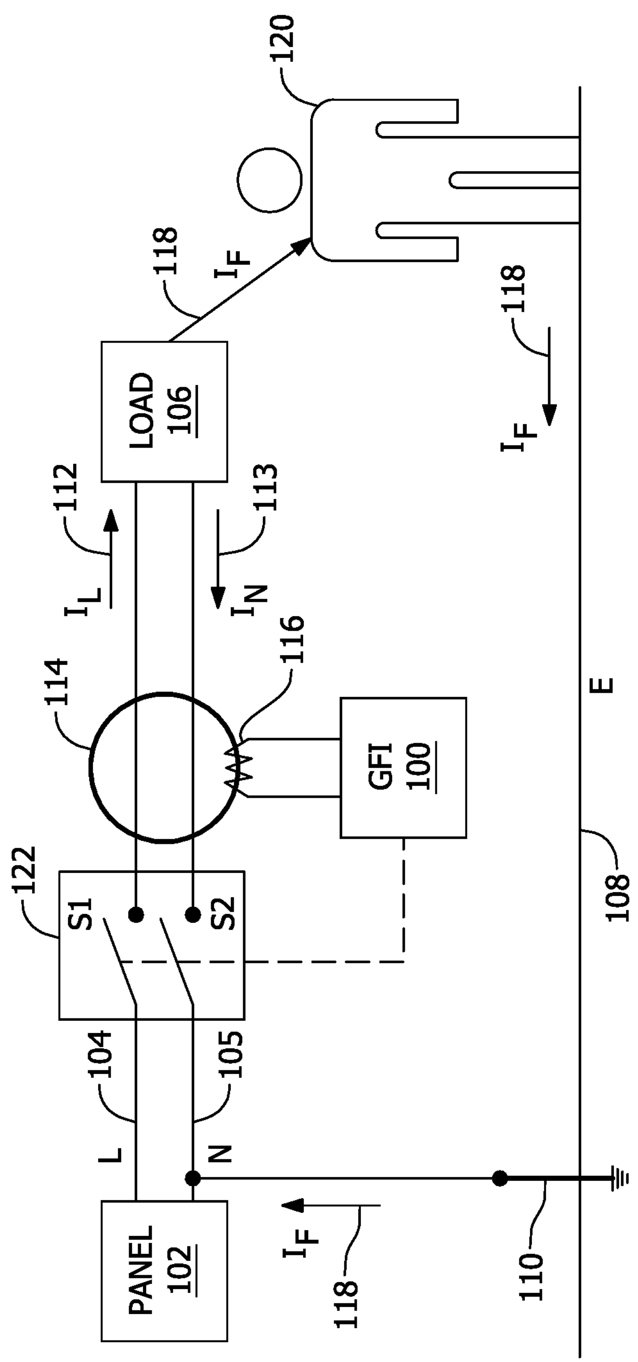
FIG. 1 depicts a known protection scheme for an electrical installation using a ground fault interrupt circuit (GFCI) device.
Figure 2:
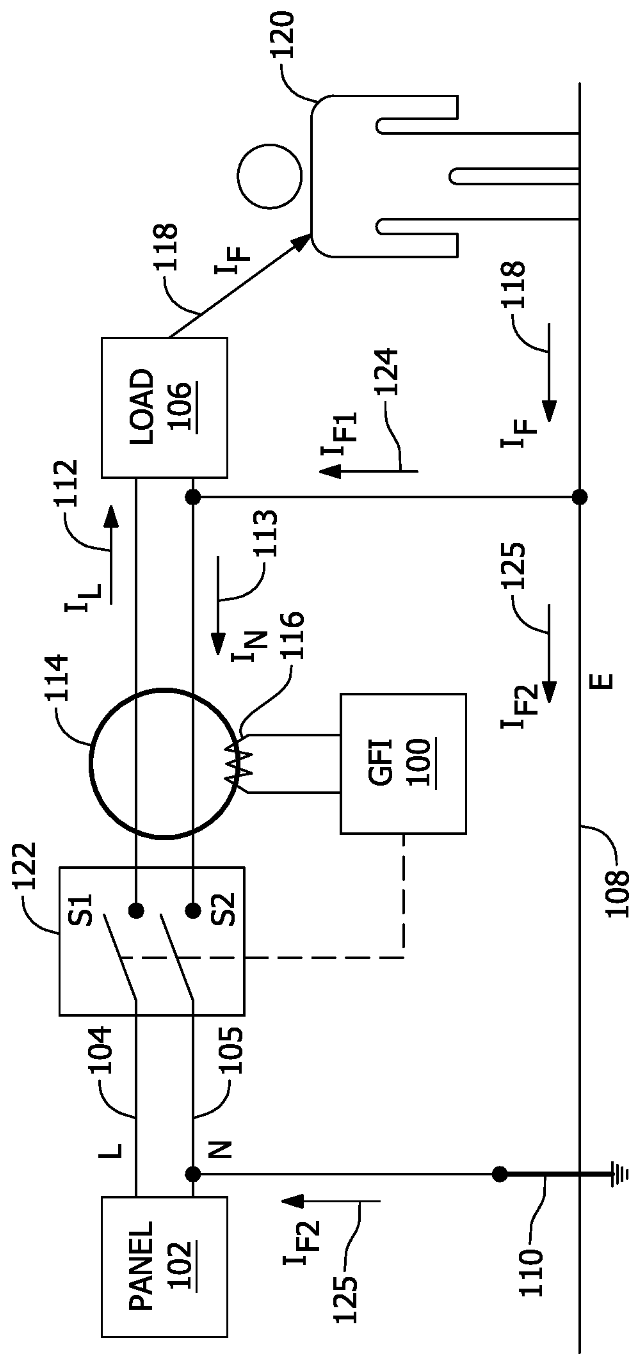
FIGS. 2 and 3 depict the electrical installation of FIG. 1 when a grounded neutral fault is present.
Figure 3:
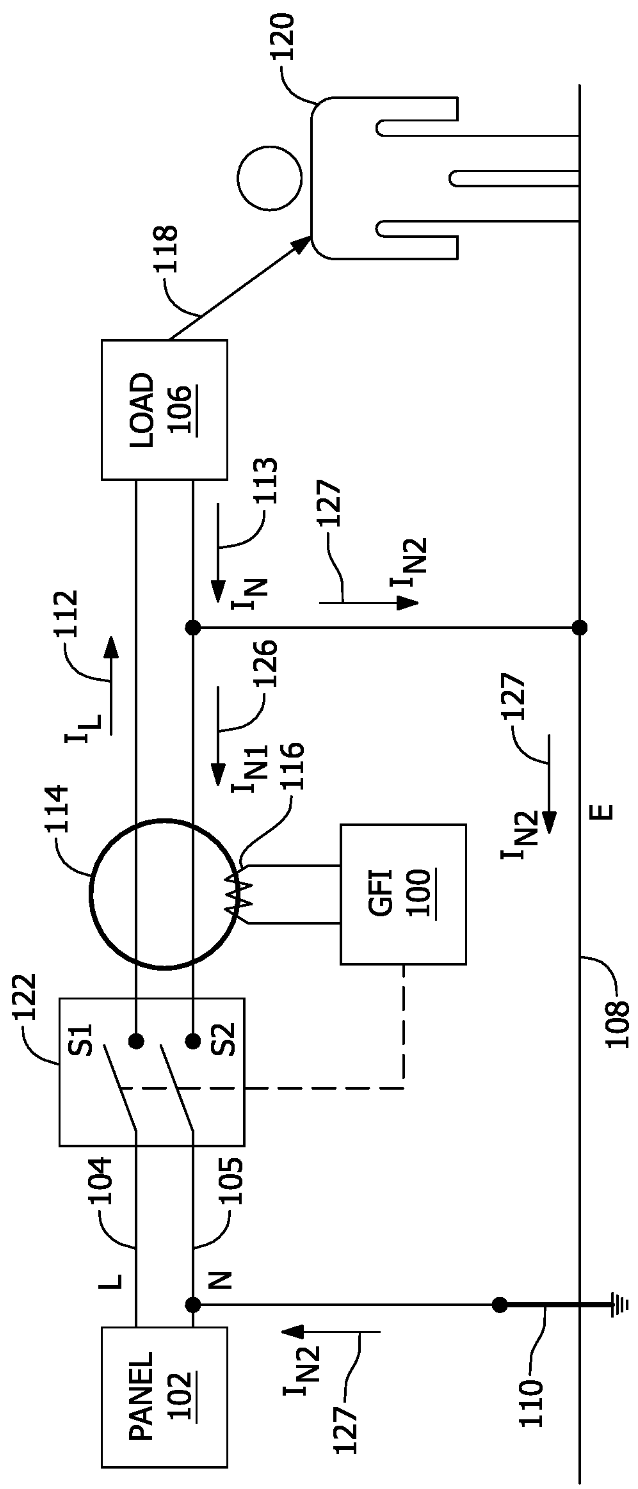

FIG. 1 depicts a known protection scheme for an electrical installation using a ground fault interrupter (GFI) 100, and FIGS. 2 and 3 depict the electrical installation of FIG. 1 when a grounded neutral fault is present in the electrical installation. GFI 100 may be referred to as a GFI circuit (GFIC) or a residual current device (RCD). The circuit depicted in FIG. 1 represents a typical single-phase alternating current (AC) on premise installation. The installation in FIG. 1 includes an electrical panel 102, which may represent where a utility electrical distribution system and the on-premise distribution system connect to each other. In the circuit of FIG. 1, electrical panel 102 distributes a line conductor 104 and a neutral conductor 105 that supply electricity to a load 106 from the electrical utility. Load 106 may be, for example, a household appliance. The voltage supplied by electrical panel 102 to load 106 in the single-phase AC circuit shown in FIG. 1 may be 230 volts or 120 volts, depending on the standards in place for the installation. For example, the voltage for single-phase AC in the United States is 120 volts (at 60 hertz), while the voltage for single-phase AC in Germany is 230 volts (at 50 hertz). In the circuit depicted in FIG. 1, the supply neutral (N) from the electrical utility is connected directly to earth 108 using one or more grounding rods 110. Typically, grounding rod(s) 110 are driven into earth 108 near electrical panel 102. In FIG. 1, the installation is protected by GFI 100, which detects ground faults and operates to disconnect load 106 from electrical panel 102 during a ground fault.

Under normal conditions, a line current (IL) 112 flows through line conductor 104 between electrical panel 102 and load 106 and a neutral current (IN) 113 flows through neutral conductor 105 between load 106 and electrical panel 102. Line current 112 and neutral current 113 alternate directions each half phase of a complete AC cycle. In FIG. 1, line current 112 and neutral current 113 are depicted during a single half phase for purposes of illustration. In an alternate half phase, line current 112 and neutral current 113 reverse direction.

In FIG. 1, line conductor 104 and neutral conductor 105 pass through the center of a current transformer 114 and form the primary windings of current transformer 114. A secondary winding 116 of current transformer 114 is connected to GFI 100. In normal operation of the circuit depicted in FIG. 1, a fault current 118 is zero or substantially zero, and the magnitudes of line current 112 and neutral current 113 flowing through current transformer 114 are the same, but they flow in opposite directions such that the resulting vector sum of line current 112 and neutral current 113 at current transformer 114 is approximately zero. Accordingly, little to no current is induced on secondary winding 116 of current transformer 114. However, if a person 120 is subjected to the voltages on line conductor 104, a non-zero fault current 118 flows through the body of person 120 to earth 108 and returns to the grounded neutral conductor 105 at electrical panel 102 through grounding rod(s) 110.

The result of fault current 118 bypassing current transformer 114 is that line current 112 flowing through current transformer 114 has a higher magnitude than neutral current 113 flowing through current transformer 114, because a portion of line current 112 is now bypassing current transformer 114 as fault current 118. In this ground fault condition, the vector sum of line current 112 to load 106 and neutral current 113 from load 106 through current transformer 114 is non-zero, resulting in an induced current in secondary winding 116 of current transformer 114. GFI 100 detects the current in secondary winding 116, and if the current exceeds a threshold current, GFI 100 opens a switch 122 to disconnect line conductor 104 and neutral conductor 105 from load 106, which terminates the ground fault.

The ability of GFI 100 to detect the current imbalance through current transformer 114 and provide protection to person 120 depends upon the single point neutral conductor ground at electrical panel 102. However, certain grounded neutral scenarios allow fault current 118 to bypass protection of GFI 100, as illustrated in FIG. 2.

In the circuit of FIG. 2, a load side of neutral conductor 105 has been inadvertently tied to earth 108. This type of condition is typically referred to as a grounded neutral fault. Grounded neutral faults may occur for a variety of reasons, including miswiring of load 106 and neutral wire insulation breakdowns. In this condition, fault current 118 flowing through the body of person 120 is split between the load-side neutral connection to earth 108 at neutral conductor 105 and the current path through earth 108 previously described with respect to FIG. 1. That is, fault current 118 is split into two components, a first fault current ($I_{F1}$) 124 and a second fault current ($I_{F2}$) 125. First fault current 124 returns to neutral conductor 105 at load 106 and flows through current transformer 114. Second fault current 125 bypasses current transformer 114 and returns to neutral conductor 105 at electrical panel 102 via grounding rod(s) 110. The result is that current transformer 114 no longer senses the full differential current between line conductor 104 and neutral conductor 105 based on fault current 118, but rather, senses a lower differential current between line conductor 104 and neutral conductor 105 that is based on second fault current 125, which is less than fault current 118. If the measured response based on the current induced on the secondary winding of the transformer due to the differential current between line current 112 and first fault current 124 is below a trip point of GFI 100, GFI 100 will not operate switch 122 to disconnect load 106 from electrical panel 102, and fault current 118 may continue to flow unimpeded through the body of person 120, which is undesirable.

In addition to the loss of protection that can arise in the grounded neutral fault condition depicted in FIG. 2, grounded neutral faults can also cause GFI 100 to generate nuisance trips that open switch 122 even when fault current 118 is substantially zero, as depicted in FIG. 3. In the circuit of FIG. 3, neutral current 113 from load 106 is split between the load-side neutral connection through the transformer and the current path through earth 108 to grounding rod(s) 110 at electrical panel 102. That is, neutral current 113 is split into two components, a first neutral current ($I_{N1}$) 126 and a second neutral current ($I_{N2}$) 127. First neutral current 126 flows through current transformer 114. Second neutral current 127 bypasses current transformer 114 and returns to neutral conductor 105 at electrical panel 102 via grounding rod(s) 110. The result is that current transformer 114 senses a differential current between line conductor 104 and neutral conductor 105 that is based on second neutral current 127. If the measured response based on the current induced on the secondary winding of the transformer due to the differential current between line current 112 and first fault current 124 is above a trip point of GFI 100, GFI 100 will operate switch 122 and disconnect load 106 from electrical panel 102, even though fault current 118 may be substantially zero (e.g., no ground fault is present). Nuisance trips are disruptive and undesirable. Further, nuisance trips may encourage people to bypass or remove fault protection devices for AC line circuits, which is also undesirable.

The systems, assemblies, and methods described herein provide for detection of grounded neutral faults using a test signal injected into a neutral conductor for an AC circuit. When a neutral conductor for the AC line circuit is grounded, a current loop exists that can be analyzed using the test signal. To avoid corruption or interference from load noise, the frequency of the test signal is determined based on the frequency spectrum of the load noise. Because the test signal is at one frequency, the current response to the test signal at that frequency may be used to determine the impedance of the current loop, thereby directly and accurately detecting the grounded neutral fault.

Figure 4A:
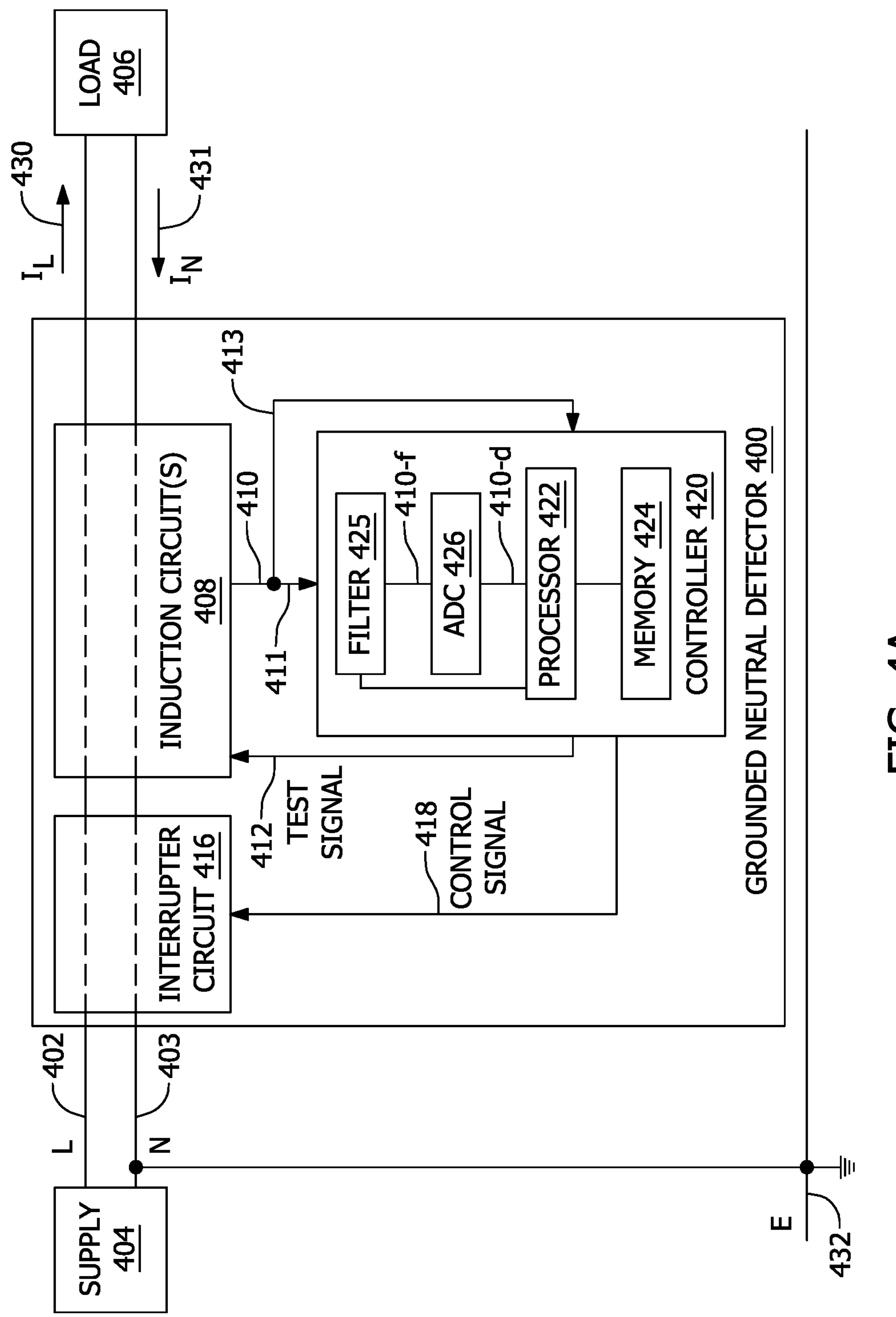
FIG. 4A is a block diagram of an exemplary grounded neutral fault detector.

FIG. 4A is a block diagram of an exemplary grounded neutral detector 400. In the exemplary embodiment, detector 400 couples with a line conductor 402 and a neutral conductor 403 between a supply 404 and a load 406. Neutral conductor 403 is grounded to earth 432 at supply 404. Detector 400 performs an analysis using a test signal 412 injected into neutral conductor 403 to determine if neutral conductor 403 is grounded. If neutral conductor 403 is grounded, then detector 400 disconnects at least line conductor 402 of supply 404 from load 406. In the embodiments described herein, line conductor 402 includes one or more electrical conductors that collectively form a current supply path between supply 404 to load 406. Further in the embodiments described herein, the neutral conductor 403 includes one or more electrical conductors that collectively form a current path between load 406 and supply 404.

Under normal conditions, a line current (IL) 430 flows through line conductor 402 between supply 404 and load 406 and a neutral current (IN) 431 flows through neutral conductor 403 between load 406 and supply 404. The line current 430 and neutral current 431 alternate directions each half phase of a complete cycle of the AC power waveform. In FIG. 4A, line current 430 and neutral current 431 are depicted during a single half phase for purposes of illustration. In an alternate half phase, line current 430 and neutral current 431 reverse direction.

In the exemplary embodiment, detector 400 includes one or more induction circuits 408. Induction circuits 408 include any component, system, or device that generates a leakage signal 410. The leakage signal 410 flows through two channels, a load noise channel 411 and a ground fault detection channel 413. Load noise channel 411 is used to measure load noise and detect a response to test signal 412. Ground fault detection channel 413 is used to detect ground fault. In addition, induction circuits 408 include any component, system, or device that injects test signal 412 into neutral conductor 403 during a testing phase to determine if neutral conductor 403 is grounded. The selection of the frequency of the test signal will be described later with respect to FIG. 6. In some embodiments, induction circuits 408 include one or more current transformers, which measure a differential current between line conductor 402 and neutral conductor 403 for load 406 and generate leakage signal 410 corresponding to the current imbalance. The current transformers are also used to inject test signal 412 into neutral conductor 403.

In the exemplary embodiment, detector 400 further includes an interrupter circuit 416. Interrupter circuit 416 includes any component, system, or device that selectively disconnects at least line conductor 402 between supply 404 and load 406 in response to receiving a control signal 418. For example, interrupter circuit 416 may include one or more normally closed switches that selectively open in response to receiving control signal 418. The switches may include mechanical relays and/or solid-state relays. In some embodiments, interrupter circuit 416 selectively disconnects both line conductor 402 and neutral conductor 403 between supply 404 and load 406 in response to receiving control signal 418.

In the exemplary embodiment, the detector 400 further includes a controller 420. Controller 420 includes any component, system, or device that controls the operation of detector 400 as described herein. In some embodiments, controller 420 includes a processor 422 and a memory 424. The processor 422 includes any electronic circuits and/or optical circuits that are able to perform the functions described herein for controller 420. The memory 424 includes any electronic circuits, optical circuits, and/or magnetic circuits that are able to store data. For instance, memory 424 stores programmed instructions which, when executed by processor 422, directs processor 422 to implement the operation of detector 400 as described herein.

Leakage signal 410 detected by induction circuit(s) 408 is sent through load noise channel 411 and ground fault detection channel 413. In load noise channel 411, leakage signal 410 may be preprocessed before it is sent to processor 422. In some embodiments, detector 400 includes a filter 425. Filter 425 includes any component, system, or device that band-limits leakage signal 410 to generate a band-limited leakage signal 410-*f*. The band-limited leakage signal 410-*f* may have a bandwidth of 4 kHz to 24 kHz to limit the leakage signal 410-*f* to be within interested frequency ranges for detection of grounded neutral fault. In the exemplary embodiment, detector 400 includes an analog-to-digital (ADC) converter 426 that digitize leakage signals 410-*f*, providing digitized leakage signals 410-*d*. Leakage signals 410, 410-*d*, 410-*f* may be collectively referred to as leakage signals 410. Filter 425 and ADC 426 may be part of controller 420 as one microprocessor chip. Alternatively, filter 425 and ADC 426 may be separate from one another, or separate from processor 422.

Figure 4B:
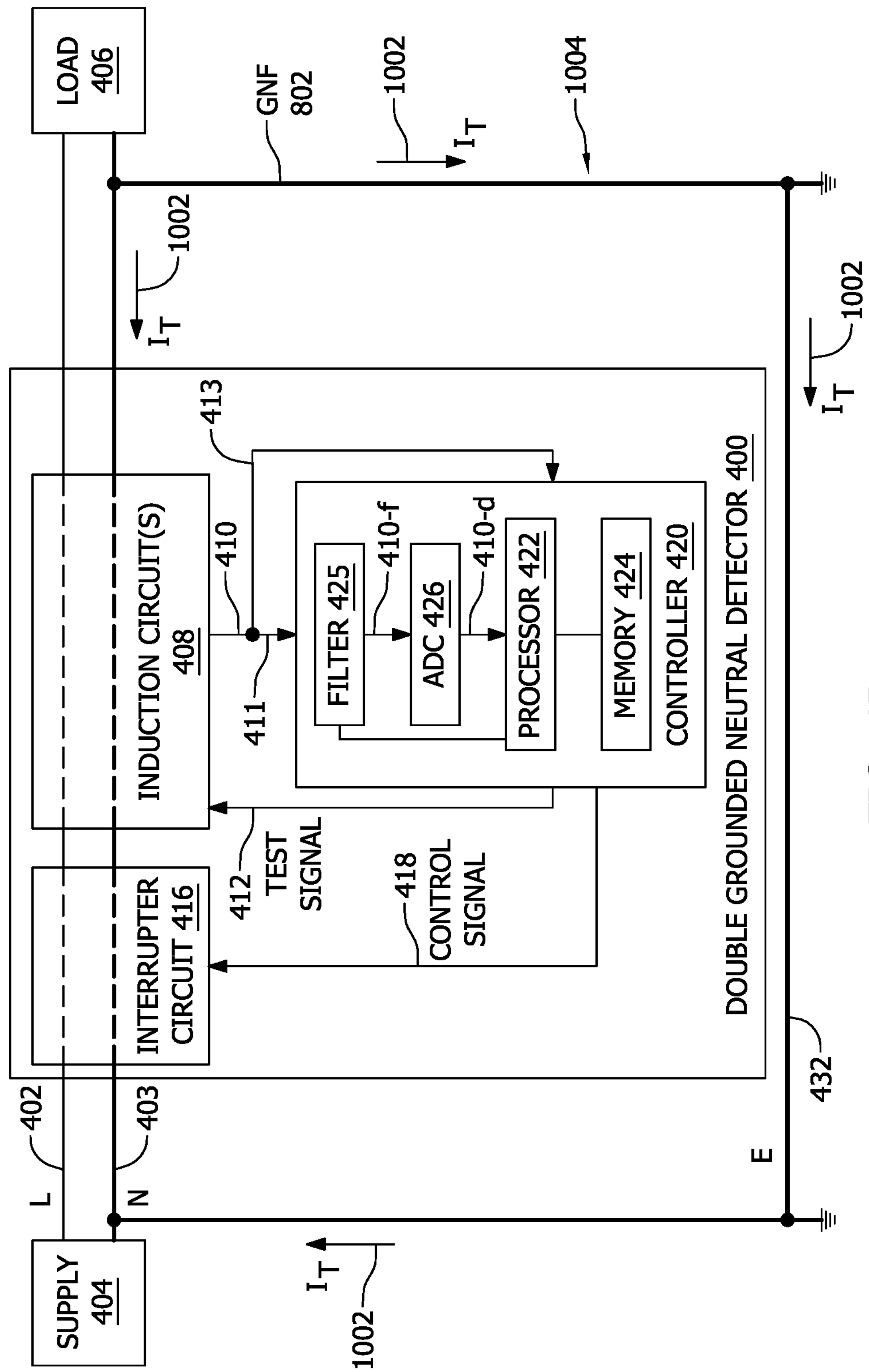
FIG. 4B is a block diagram of the detector shown in FIG. 4A when a grounded neutral fault is present.

FIG. 4B is a block diagram of detector 400 during testing. In operation, controller 420 generates test signal 412, which is injected into neutral conductor 403 using induction circuits 408. If a grounded neutral fault (GNF) 802 exists, a test current 1002 flows in a current loop 1004 formed by neutral conductor 403 for load 406, GNF 802, ground 432, with magnitude of the test current depending on the impedance or admittance of current loop 1004. A current loop does not exist for line conductor 402 such that test current generates a differential current between line conductor 402 and neutral conductor 403 at induction circuits 408 and correspondingly, induction circuits 408 generate a non-zero value for the leakage signal 410. If the impedance is high, a grounded neutral fault likely does not exist. If the impedance is low, a grounded neutral fault likely exists. Therefore, measurement of the impedance of current loop 1004 is used to detect GNF 802. Impedance of current loop 1004 is determined based on injected test signal 412 and leakage signal 410.

Leakage currents from switching power electronics of connected load 406, however, can corrupt the measurement if the leakage currents from load 406 are at the same frequency as the injected current. Leakage currents from the load are also referred to as load noise. The systems and methods described herein include determining or selecting the frequency of test signal 412 in order to minimize interference in grounded neutral detection caused from load noise.

Figure 5:
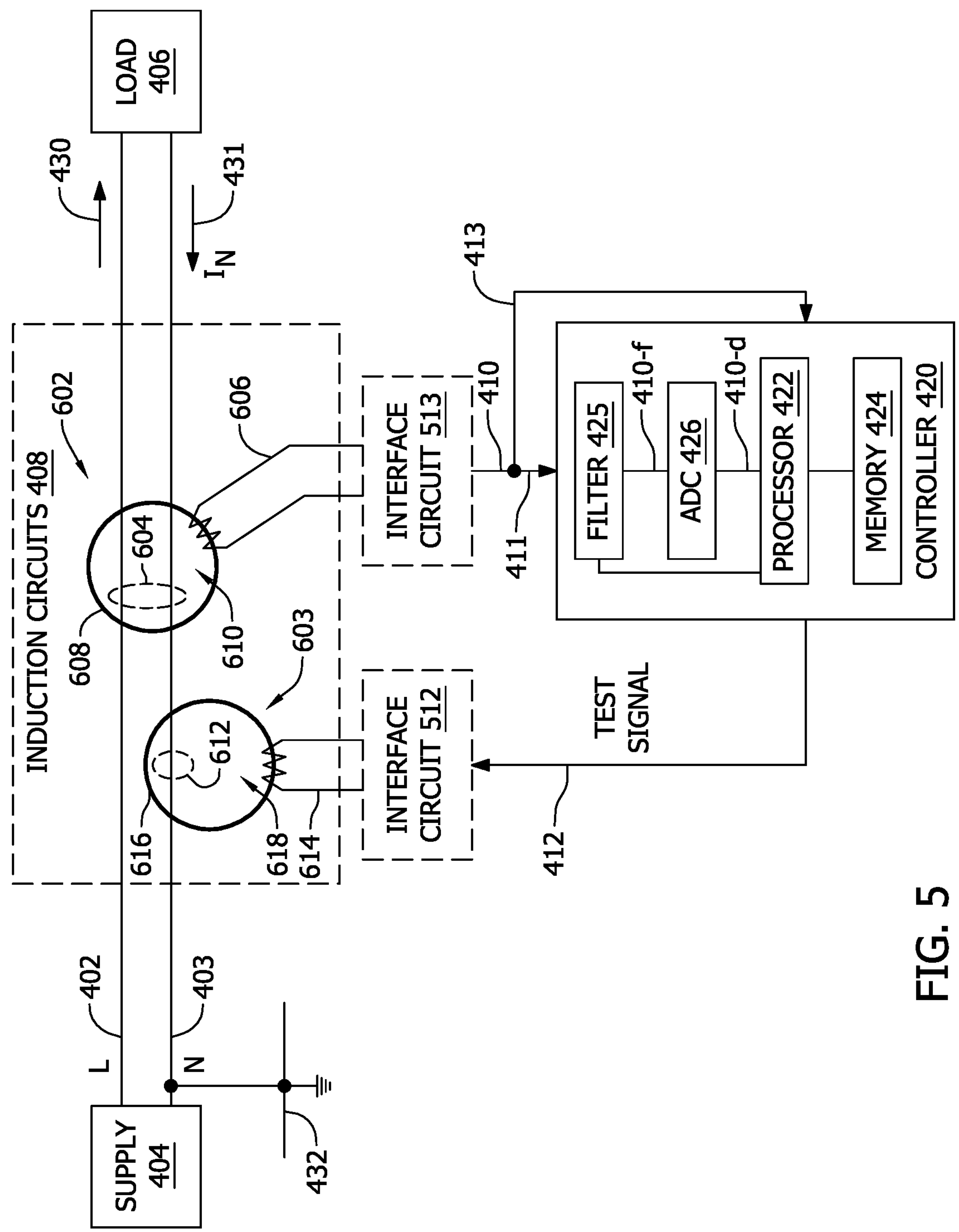
FIG. 5 depicts an exemplary circuit configuration for the detector of FIG. 4A.

FIG. 5 depicts an exemplary configuration of induction circuits 408 for detector 400. In the exemplary embodiment, induction circuits 408 include a first current transformer 602 and a second current transformer 603. The first current transformer 602 includes primary windings 604 formed from line conductor 402 and neutral conductor 403, and a secondary winding 606 magnetically coupled to primary windings 604. The secondary winding 606 generates leakage signal 410 based on the differential current flowing between line conductor 402 and neutral conductor 403 at first current transformer 602. In one embodiment, first current transformer 602 includes a core 608 that is metallic, and primary windings 604 pass through an inner region 610 of core 608. In some embodiments, core 608 is an air core. The second interface circuit 513 is coupled to secondary winding 606 of first current transformer 602.

In the depicted embodiment, second current transformer 603 includes a primary winding 612 formed from neutral conductor 403 and a secondary winding 614 magnetically coupled to primary winding 604. The secondary winding 614 is used to inject test signal 412 into neutral conductor 403. In one embodiment, second current transformer 603 includes a core 616 that is metallic, and primary winding 612 passes through an inner region 618 of core 616. In some embodiments, core 608 is an air core. The first interface circuit 512 is coupled to secondary winding 614 of second current transformer 603.

In some embodiments, a first interface circuit 512 communicatively couples the test signal 412 to the secondary winding 614 (e.g., converts a single-ended test signal 412 to a differential signal on the secondary winding 614), and a second interface circuit 513 communicatively couples to the secondary winding 606 to generate the leakage signal 410 (e.g., converts a differential signal on the secondary winding 606 to a single-ended leakage signal 410). In one embodiment, the test signal 412 includes a sinusoidal signal generated by the controller 420 at a selected frequency, and the first interface circuit 512 includes a differential amplifier circuit that excites the secondary winding 614 based on the test signal 412.

In some embodiments, induction circuits 408 include only first current transformer 602 without second current transformer 603, where current transformer 602 includes two secondary windings 606, 614 both magnetically coupled to primary windings 604. The remaining circuit is the same as that depicted in FIG. 6. That is, secondary winding 606 is electrically connected to interface circuit 513 and is used to detect leakage signal based on the differential current flowing between line conductor 402 and neutral conductor 403 through current transformer 602, and secondary winding 614 is electrically connected to interface circuit 512 and is used to inject test signal 412 into neutral conductor 403.

Figure 6:
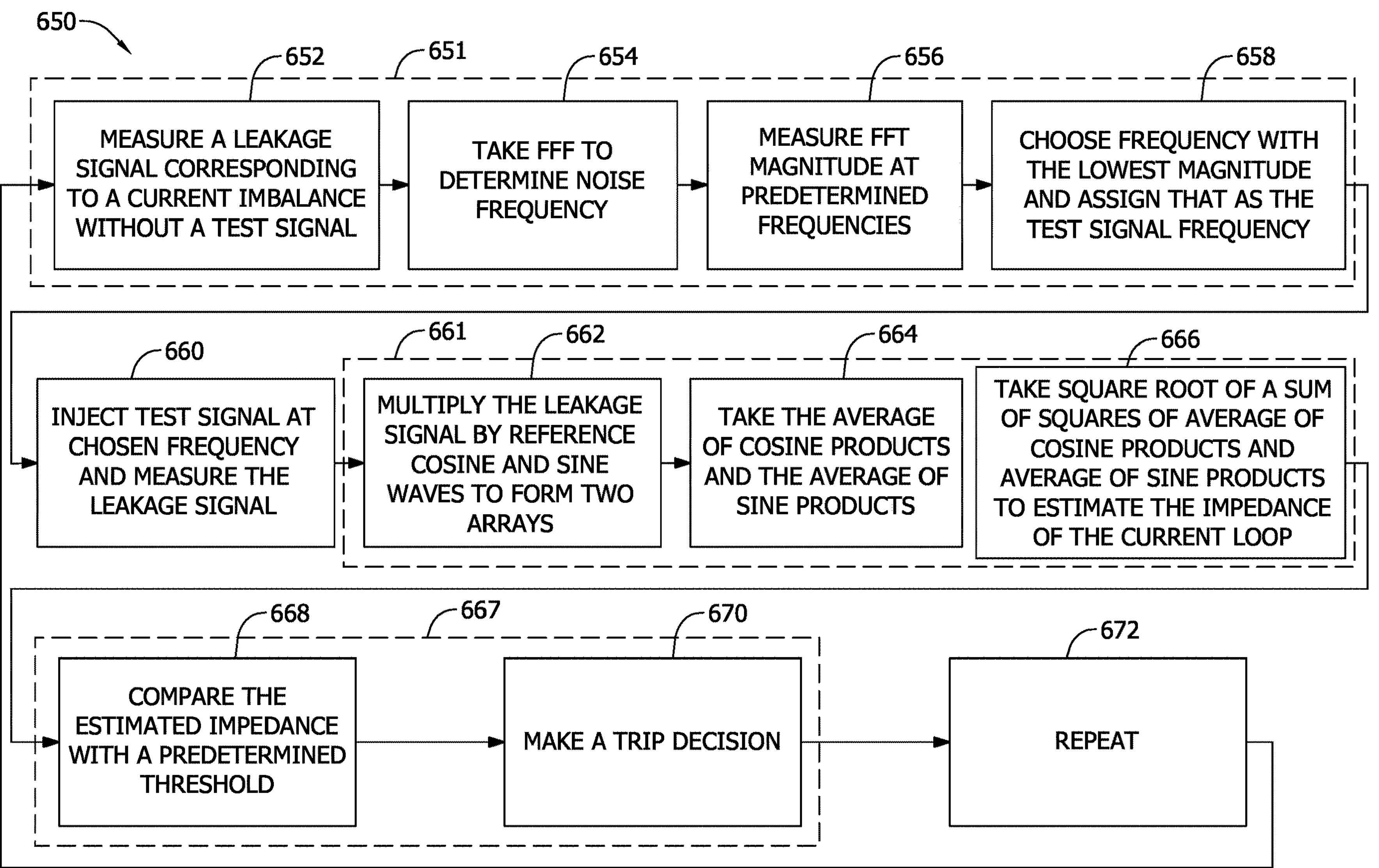
FIG. 6 is a flow chart of an exemplary method of detecting a grounded neutral fault.

FIG. 6 is a flow chart of an exemplary method 650 of detecting a grounded neutral fault. Method 650 will be discussed with respect to the detector 400, although the method 650 may be performed by other systems not shown.

In the exemplary embodiment, method 650 includes determining 651 a frequency to be used for a test signal. Determining 651 includes measuring 652 a leakage signal corresponding to a current imbalance between a line conductor and a neutral conductor for the load without a test signal being injected. The leakage signal measured without a test signal being injected is the load noise. The measured leakage signal may be input into an ADC and be digitized. The measured leakage signal may be filtered before being digitized, limiting the leakage signal to a bandwidth such as 2 kHz to 20 kHz. The order of digitization and filtering may be reversed, where the leakage signal is digitized and then filtered. Determining 651 further includes Fourier transforming 654 the leakage signal to determine noise frequency spectrum. Fast Fourier transform algorithm may be used to calculate the noise frequency spectrum. To increase the speed and/or reduce the amount of data, a duration of leakage signal 410 acquired during measuring 652 is relatively short. For example, the duration of the leakage signal 410 acquired without a test signal 412 being injected is 0.5 ms at a sampling rate of 64 kHz. As a result, 32 samples of the load noise are measured. A 32 bin fast Fourier transform (FFT) is performed and magnitudes at multiples of 2 kHz are derived. Magnitudes of the Fourier transformed signal are measured 656. In some embodiments, magnitudes of all digital frequencies are measured. In some embodiments, magnitudes at a plurality of predetermined frequencies are measured 656. The number of predetermined frequencies may be 3, 4, or 6. In one example, six predetermined frequencies at 10 kHz, 12 kHz, 14 kHz, 16 kHz, 18 kHz, and 20 kHz are used, where simulation shows that these frequencies provide robust test signals for detecting a grounded neutral fault in the presence of load noise. Determining 651 further includes choosing 658 frequency with the lowest magnitude and assign that frequency as the test signal frequency. In the one embodiment, the frequency having the lowest magnitude among the predetermined frequencies is chosen. In some embodiments, a frequency having the lowest magnitude among all digital frequencies is chosen. Because the frequency having the lowest magnitude is chosen, least amount of interference from load noise will be presented in the test results.

In the exemplary embodiment, method 660 includes injecting 660 a test signal at the chosen frequency and measuring the leakage signal. The injected test signal 412 is a sinewave voltage at the chosen frequency. Leakage signal 410 is the current imbalance between line conductor 402 and neutral conductor 403 for load 406 with test signal 412 injected. The leakage signal 410 may be filtered and/or digitized. The order of digitization and filtering may be reversed, where the leakage signal 410 is digitized and then filtered. Method 650 further includes measuring 661 impedance of the current loop formed by potential neutral ground fault (see FIG. 4B). The leakage signal 410 represents the current response to the injected fixed frequency sinewave voltage. Magnitude of the current response at the fixed frequency therefore is calculated to derive admittance, which is the reciprocal of impedance. The signal at the chosen frequency is measured using the following digital Fourier transform (DFT) equation:

$$X_k = \frac{1}{N}\sum_{n=0}^{N-1} x_n \cdot e^{-\frac{i2\pi}{N}kn} = \frac{1}{N}\sum\nolimits_{n=0}^{N-1} x_n \cdot \left[\cos\left(\frac{2\pi}{N}kn\right) - i\,\sin\left(\frac{2\pi}{N}kn\right)\right] \quad (1)$$

where $X_k$ is the frequency-domain leakage signal at the chosen frequency k, $x_n$ is the digitized leakage signal or samples, and N is the total number of samples. Because the current response frequency is the same as the test signal frequency, the DFT equation (1) only needs to be computed for a single k that corresponds to the test signal frequency.

In some embodiments, an FFT is performed on the samples and the magnitude of the current response at the chosen frequency is determined.

In the exemplary embodiment, the current response to the test signal is determined using quadrature detection, where the current response only at the chosen frequency is determined, instead of performing an FFT on the samples, where the full spectrum of the leakage signal is derived. The leakage signal samples are multiplied 662 by reference cosine and sine waveforms to form two arrays, a cosine product array and a sine produce array (see Eqn. 1). An average of cosine and sine product arrays is taken 664 to derive an average of cosine products and an average of sine products. Square root of the sum of squares of the two averages is taken 666 to estimate the magnitude of the current response at the chosen frequency. In one example, part of the computation of magnitude of the current response at the chosen frequency is determined as the data flow in from the ADC, instead of performing spectral analysis after all samples have been received. Two accumulators may be used, a first one for cosine products and a second one for sine products. Two arrays of cosine and sine waves at the chosen frequencies may be stored in controller 420, such as in two circular buffers. Between two adjacent samples, the earlier sample of the two adjacent sample is multiplied by the corresponding entries in the cosine and sine arrays to derive a cosine product and a sine product as the samples flow into the controller 420 and the products are accumulated in the accumulators. That is, the cosine product is added to the sum of previous cosine products in the first accumulator and the sine product is added to the sum of previous sine products in the second accumulator. By the time samples are completed, the operation of Eqn. (1) is almost completed, except for multiplications for the last sample, adding the last products, and scaling by 1/N. The magnitude of the current response $X_k$ is the square root of the sum of squares of the averaged products in the accumulators. As such, instead of performing FFT and deriving the current response at all frequencies, Fourier transform is only performed at the discrete frequency of the chosen frequency (see Eqn. (1)). As a result, the time spent in computation is largely reduced and demand on the speed of microprocessor is largely reduced, compared to performing a full FFT on the samples. Impedance is inverse of admittance, which is proportional to magnitude of the current response. Therefore, impedance of the current loop from potential grounded neutral is estimated.

Continuing with the example used in describing determining 651 a frequency to be used for a test signal, the current response may be sampled at 64 kHz and the sampling duration is 128 ms. Therefore 8192 samples of the current response are acquired. Between each sample, two multiplications, one being the sample multiplied by a corresponding point on the cosine wave at the test frequency and one being the sample multiplied by a corresponding point on the sine wave at the test frequency, are performed, and the products of the multiplications are each accumulated in an accumulator. By the time the last sample is completed, measuring 661 impedance of the current loop is almost completed except for the two multiplications for the last sample, adding the products for the last sample to the accumulators, taking 664 average of products in each accumulator, and taking square root of the sum of squares of the averaged products.

In the exemplary embodiment, the sampling rate and total duration of samples are chosen such that the samples include an integer number of cycles or wavelengths of the test signal. A full cycle of the reference cosine and sine waveforms at the test frequency are stored in controller 420. To reduce complexity in implementation, the same number of samples are acquired each time a test signal is sent, and the sampling rate of the leakage signal remains the same in method 650. In one example, the frequency of FFT bins are rounded numbers, such as multiple of 2000 Hz and sampling rate and test frequency are rounded numbers, such as multiple of 2000 Hz. Number of data points needed to be stored for a full cycle of cosine or sine waveforms at test frequencies may be minimized. For example, the sampling rate is set at 64 kHz, and 8192 sample points or samples are acquired in 128 ms. At this sampling rate and sampling duration, regardless of the test frequency chosen (assuming it is a bin frequency of the FFT), samples have an integer number of cycles of the test signal and the amount of data points needed to be stored for the cosine/sine waveforms is at most 32 because the waveform repeats itself. Alternatively, all data for the cosine and sine waveforms may be stored in one table and pointers are used to jump around the table to match the test frequency for a cosine or sine value. This is because all numbers in the table of a sine wave at 10 kHz are also in a table for a sine wave at 20 kHz, but in a different order. Therefore, cosine and sine waveforms are not stored at two locations, and instead are created by jumping around the table at different test frequencies.

In the exemplary embodiment, method 650 further includes determining 667 a grounded neutral fault based on the estimated impedance. The estimated impedance is compared 668 with a predetermined threshold. A trip decision is made 670 based on the comparison. If the estimated impedance is lower than the threshold, the trip decision is "yes," where GFCI decision may need to be tripped. If the estimated impedance is greater than the threshold, the trip decision is "no," where the GFCI should not be tripped. The threshold may be in the range of from 2 ohm to 6 ohm. Under a UL standard, if the impedance is 2 ohm or less, the GFCI should be tripped, indicating that a grounded neutral fault exists. The threshold should not be too high, e.g., greater than 6 ohm. Otherwise, GFCI trips unnecessarily, resulting in nuisance tripping.

In some embodiments, method 650 may further include repeating 672 from determining 651 a frequency to determining 667 a grounded neutral fault as described above. The frequency of the load noise may have shifted to the test frequency after determining 651 the frequency of the test signal. Therefore, the leakage signal used to measure the current response to the test signal may have been corrupted by the load noise and the estimated impedance may be inaccurate. To increase the accuracy in detecting grounded neutral fault, repeating 672 is applied. In one example, a counter is used to sum up the number of times when a grounded neutral fault is determined to exist or the tripping decision is "yes." The higher the number, the higher likelihood is the existence of a grounded neutral fault. For example, during a time period of two seconds, the time duration before the GFCI device should be tripped if a fault exists, the process may be repeated until a threshold number in the counter is reach. If the threshold, such as 3 or 4, is reached, the GFCI device is tripped. Alternatively, the test duration may be set to less than two seconds. In some embodiments, the process is repeated until a fault such as a ground fault or a grounded neutral fault is detected. Alternatively, the process is repeated until the GFCI device is tripped. In one example, determination of the frequency of the test signal takes approximately 0.5 ms. Duration of approximately 100 ms of a current response to the test signal is collected. Because the spectral analysis of the current response is performed instantaneously as the current response is input into a processor, the determination of grounded neutral fault may take approximately 100 ms, allowing the detection process to be repeated approximately 20 times.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

At least one technical effect of the systems and methods described herein includes (a) eliminating or reducing nuisance trips during grounded neutral faults; (b) quickly and accurately determining when grounded neutral faults are present in AC power circuits; (c) reducing interference from load noise by injecting a test signal at a frequency having the lowest magnitude in the frequency spectrum of the load noise; and (d) increasing processing speed and/or reduce demand of storage by quadrature detection of a current response to the test signal.

Exemplary embodiments of systems and methods of grounded neutral fault detection are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A grounded neutral fault detector, comprising:
- induction circuits configured to:
  - generate a leakage signal corresponding to a current imbalance between a line conductor and a neutral conductor for a load; and
- a controller configured to:
  - determine a frequency of a test signal by:
    - measuring load noise based on a first leakage signal without the test signal being injected, the first leakage signal corresponding to a first current imbalance between the line conductor and the neutral conductor for the load when the test signal is not being injected into the neutral conductor;
    - analyzing a frequency spectrum of the load noise; and
    - selecting the frequency of the test signal based on the frequency spectrum of the load noise;
  - inject the test signal at the selected frequency to the neutral conductor;
  - measure impedance of a current loop formed by a potential grounded neutral fault based on a second leakage signal corresponding to a second current imbalance with the test signal being injected; and
  - determine a grounded neutral fault based on the measured impedance.

2. The detector of claim 1, wherein the controller is further configured to select the frequency of the test signal corresponding to a frequency at which the load noise has the lowest magnitude.

3. The detector of claim 1, wherein the controller is further configured to:
- perform a Fourier transform of the load noise to derive a frequency spectrum of the load noise;
- measure magnitudes of the load noise at a plurality of frequencies based on the frequency spectrum of the load noise; and
- select the frequency corresponding to a frequency having the lowest magnitude among the plurality of frequencies.

4. The detector of claim 1, wherein the controller is further configured to:
- determine a current response at the selected frequency to the test signal; and
- determine the impedance of the current loop as being inversely proportional to a magnitude of the current response.

5. The detector of claim 4, wherein the controller is further configured to:
- between two adjacent samples of a second leakage signal,
  - multiply an earlier sample of the two adjacent samples with a corresponding point in a reference cosine waveform to derive a cosine product, the reference cosine waveform having the selected frequency;
    - multiply the earlier sample with a corresponding point in a reference sine waveform to derive a sine product, the reference sine waveform having the selected frequency;
  - add the cosine product to a first accumulator; and
  - add the sine product to a second accumulator;
- multiply a last sample with the corresponding point in the reference cosine waveform to derive a last cosine product;
- multiply the last sample with the corresponding point in the reference sine waveform to derive a last sine product;
- add the last cosine product to the first accumulator;
- add the last sine product to the second accumulator; and
- determine the magnitude of the current response as a square root over a sum of a square of an average of cosine products and a square of an average of sine products.

6. The detector of claim 5, wherein the reference cosine waveform and the reference sine waveform are prestored at the same location.

7. The detector of claim 5, wherein a full cycle of the reference cosine waveform and the reference sine waveform are prestored.

8. The detector of claim 1, wherein the controller is further configured to repeat determining a frequency, injecting the test signal, measuring impedance, and determining the grounded neutral fault.

9. The detector of claim 8, wherein a sampling rate of the first leakage signal and the second leakage signal remains the same, and a sampling duration of the first leakage signal and the second leakage signal remains the same.

10. The detector of claim 1, wherein samples of the second leakage signal have an integer number of cycles of the test signal.

11. A method of detecting a grounded neutral fault, comprising:

determining a frequency of a test signal by:

measuring load noise based on a first leakage signal without the test signal being injected, the first leakage signal corresponding to a first current imbalance between a line conductor and a neutral conductor for a load when the test signal is not being injected into the neutral conductor;

analyzing a frequency spectrum of the load noise; and selecting the frequency of the test signal based on the frequency spectrum of the load noise;

injecting the test signal at the selected frequency to the neutral conductor;

measuring impedance of a current loop formed by a potential grounded neutral fault based on a second leakage signal corresponding to a second current imbalance with the test signal injected; and determining a grounded neutral fault based on the measured impedance.

12. The method of claim 11, wherein selecting the frequency further comprises selecting the frequency of the test signal corresponding to a frequency at which the load noise has the lowest magnitude.

13. The method of claim 11, wherein:

analyzing a frequency spectrum further comprises performing a Fourier transform of the load noise to derive the frequency spectrum of the load noise; and selecting the frequency further comprises:

measuring magnitudes of the load noise at a plurality of frequencies based on the frequency spectrum of the load noise; and selecting the frequency corresponding to a frequency having the lowest magnitude among the plurality of frequencies.

14. The method of claim 11, wherein measuring impedance further comprises:

determining a current response at the selected frequency; and determining the impedance of the current loop as being inversely proportional to a magnitude of the current response.

15. The method of claim 14, wherein determining a current response further comprises:

between two adjacent samples of a second leakage signal, multiplying an earlier sample of the two adjacent samples with a corresponding point in a reference cosine waveform to derive a cosine product, the reference cosine waveform having the selected frequency;

multiplying the earlier sample with a corresponding point in a reference sine waveform to derive a sine product, the reference sine waveform having the selected frequency;

adding the cosine product to a first accumulator; and adding the sine product to a second accumulator;

multiplying a last sample with the corresponding point in the reference cosine waveform to derive a last cosine product;

multiplying the last sample with the corresponding point in the reference sine waveform to derive a last sine product;

adding the last cosine product to the first accumulator;

adding the last sine product to the second accumulator; and determining the magnitude of the current response as a square root over a sum of a square of an average of cosine products and a square of an average of sine products.

16. The method of claim 15, wherein the reference cosine waveform and the reference sine waveform are prestored at the same location.

17. The method of claim 15, wherein a full cycle of the reference cosine waveform and the reference sine waveform are prestored.

18. The method of claim 11, further comprising repeating determining a frequency, injecting the test signal, measuring impedance, and determining the grounded neutral fault.

19. The method of claim 18, wherein a sampling rate of the first leakage signal and the second leakage signal remains the same, and a sampling duration of the first leakage signal and the second leakage signal remains the same.

20. The method of claim 11, wherein samples of the second leakage signal have an integer number of cycles of the test signal.

* * * * *